United States Patent [19]

Butherus et al.

[11] 4,403,241
[45] Sep. 6, 1983

[54] METHOD FOR ETCHING III-V SEMICONDUCTORS AND DEVICES MADE BY THIS METHOD

[75] Inventors: Alexander D. Butherus, Lebanon; Lucian A. D'Asaro, Madison, both of N.J.

[73] Assignee: Bell Telephone Laboratories, Incorporated, Murray Hill, N.J.

[21] Appl. No.: 180,358

[22] Filed: Aug. 22, 1980

[51] Int. Cl.³ .................... H01L 29/06; H01L 29/80
[52] U.S. Cl. ....................................... 357/55; 357/22
[58] Field of Search ..................... 357/22, 55, 68, 16

[56] References Cited

U.S. PATENT DOCUMENTS 3,986,196 10/1976 Decker et al. ..................... 357/22
4,065,742 12/1977 Kendall et al. ................. 357/55 X
4,171,234 10/1979 Nagata et al. ................... 357/16 X

OTHER PUBLICATIONS

S. Iida and K. Ito, "Selective Etching of Gallium Arsenide Crystals in $H_2SO_4$–$H_2O_2$–$H_2O$ System", *Journal of the Electrochemical Society*, vol. 118, (1971), pp. 768–771.

D. W. Shaw, "Localized GaAs Etching with Acidic Hydrogen Peroxide Solutions", *Journal of the Electrochemical Society*, vol. 128, (1981), pp. 874–880.

*Primary Examiner*—James W. Davie
*Assistant Examiner*—J. Carroll
*Attorney, Agent, or Firm*—Bernard Tiegerman; Bruce S. Schneider

[57] ABSTRACT

The use of an anisotropic etchant containing $BCl_3$ and a source of atomic chlorine for III–V semiconductor materials has yielded improved results for semiconductor devices. For example, via gallium arsenide field effect transistors produced using this anisotropic etchant to fabricate via holes exhibit excellent electrical characteristics.

3 Claims, 6 Drawing Figures

METHOD FOR ETCHING III-V SEMICONDUCTORS AND DEVICES MADE BY THIS METHOD

BACKGROUND OF THE INVENTION

1. Field of the Invention

This invention relates to semiconductor processing and, more particularly, to processing of III-V semiconductors.

2. Art Background

A variety of semiconductor devices based on III-V semiconductor materials are now commercially available. For example, gallium arsenide field effect transistors (GaAs FETs) are presently widely used in microwave circuitry. A series of improvements have substantially increased the performance and reliability of these devices. For example, the use of contacts to the source electrodes made through the semiconductor body of the device has been proposed as a method of improving performance. (See U.S. Pat. No. 3,986,196, issued Oct. 12, 1976.) These transistors, such as shown in FIG. 1, have a characteristic via contact, i.e., a hole through the GaAs substrate semi-insulating region, 11, buffer region 12, and active region, 13, which provides contacts to the source electrode, 14, and which engender the name via transistors. Generally, the fabrication of these III-V devices has relied on techniques, such as chemical vapor deposition, photolithography, and wet etching. Although these techniques in many instances have provided operative devices, a search is continuing for fabrication methods that either produce devices of higher quality or lead to a better production yield.

SUMMARY OF THE INVENTION

Anisotropic etching of III-V semiconductor materials is achieved using a plasma etch method. This method involves introducing the III-V semiconducting material in a plasma discharge that has been induced in an atmosphere containing $BCl_3$ and a source of atomic chlorine, e.g., $Cl_2$. The use of this atmosphere produces etch holes with essentially vertical walls. Most significantly this technique allows improvement in semiconducting devices based on III-V materials. For example, the use of this anisotropic etching method to produce the via holes in devices utilizing III-V semiconductor materials such as via GaAs FETs substantially improves obtainable yield and performance.

DETAILED DESCRIPTION

Anisotropic etching of III-V semiconductors such as GaAs, InP, and GaP is achieved using a plasma etching process that relies on a mixture of $BCl_3$ together with a source of atomic Cl, such as $Cl_2$, as the etchant mixture. Typically, before etching, a delineating material is placed on the material to be etched so that only the area to be removed is exposed. This area and the underlying volume is then etched. It is necessary to utilize a specific combination of an atomic chlorine source and $BCl_3$ in a specific concentration range to achieve anisotropic etching, i.e., etching where the angle, 15, between a normal, 16, to the plane of the substrate exposed surface, 17, and an imaginary dotted line, 18, (FIG. 2,) drawn from the point of intersection of the sidewall with the exposed surface of the substrate to the midpoint of the sidewall, is no larger than $\pm 10$ degrees, and where the etch pit opening, 19, extends a distance, 21, beyond the delineating material (24 in FIG. 3) no more than 20 percent of the etch pit depth, 29. Generally, the chlorine source should be in the range of 5 to 13 percent of the $BCl_3$. (Percentages are given on a percent by volume basis.) Additionally, the partial pressure for the chlorine source/$BCl_3$ mixture should be in the range 50 to 200 microns. Deviation from these proportions and pressures causes a corresponding deviation from the production of anisotropic etching. For most applications associated with the processing of III-V semiconductors significant variation from the given ranges are not typically desirable.

Figure 4:
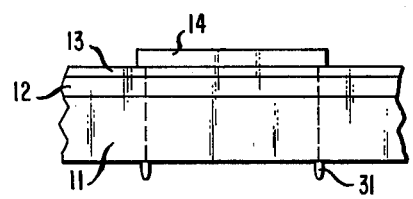

The etching process is a chemical plasma etching procedure rather than a reactive ion etching process. In the former, the removal of materials is primarily induced by the chemical reaction of the ions produced in a plasma with the material being etched. In the latter technique in addition to removal of material through chemical reactions, collisional processes, e.g., sputtering, account for a significant percentage of the material removal. Such sputter removal is easily detected by the observation after removal of the delineating material of an earlike structure similar to 31 in FIG. 4 at the etch pit opening. A configuration of electrodes that produces a chemical plasma etching procedure is advantageously utilized. For example, it is desirable to use electrodes having the same shape and that are symmetrically placed and parallel to each other. In operation, one electrode is grounded, the material to be etched is preferably placed on the other electrode, and a high frequency (typically 50 to 50,000 KHz), electrical potential in the range 500 to 1500 volts is applied between the electrodes. A plasma is struck between the two electrodes using microwave power densities in the range 0.5 to 2 Watts/$cm^2$.

The processing conditions significantly affect the etch rate of the semiconductor material, the etch rate of the resist, and the extent of undercutting. In the fabrication of semiconductor devices, typically, the areas to be etched are delineated using a resist material. This resist material is coated on the surface of the substrate material and is selectively removed to expose the areas of the substrate material with its underlying layers that are to be etched. The etching procedure removes the exposed material, and to a lesser degree removes (1) the resist material and (2) the material below the resist, but adjacent to the material being removed.

Figure 3:
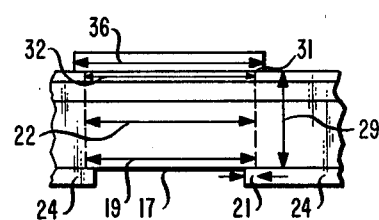

No etching procedure is perfectly anisotropic—induces no undercutting of the resist pattern; no etching procedure leaves the resist completely unaffected. (Undercutting is shown in FIG. 3 as the distance, 21. This is an area which extends under the resist material.) For example, in the subject process an increase in total pressure increases the undercutting and the etch rate of the GaAs, but decreases the etch rate of the resist. An increase in the percentage of the source of chlorine, e.g., $Cl_2$, in the $BCl_3$ mixture increases all three factors. Since undercutting and etching of the resist material is generally undesirable and an increase in etch rate of the semiconductor material is desirable, it is advantageous to reduce the former factors while enhancing the latter. This is typically done by utilizing the processing conditions previously given. Deviation from these conditions generally causes an excessive increase in undercutting and resist etching while undesirably decreasing the III–V semiconductor material etch rate.

Figure 1:
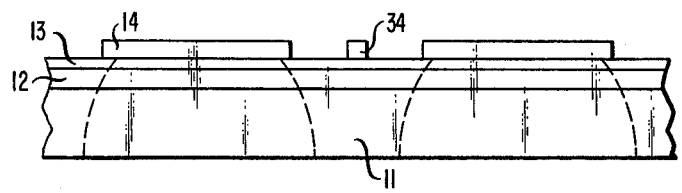
FIG. 1 illustrates via passages obtained using conventional techniques such as wet etching.
Figure 2:
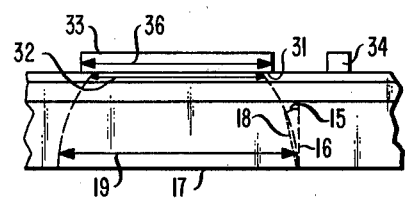
FIGS. 2-6 illustrate characteristics of devices within the subject invention.

The attainment of anisotropic etching in III–V semiconductor materials together with acceptable GaAs etch rates and resist etch rates has made possible the production of devices utilizing III–V semiconductor materials, such as a GaAs FET, having advantageous properties and reproducible yields. In a preferred embodiment, exemplary via GaAs FETs are produced. These transistors are processed substantially as described in *IEEE Transactions on Microwave Theory and Techniques,* vol. MTT-27, pages 370–372 (1979). However, the electrical contacts to a region of metallic conductivity that contacts the GaAs active region, e.g., the source, drain or gate pads, are made through the GaAs layers to the metallic conductive area by using a $BCl_3$/source of chlorine etch. For example, the contact is made to the source pad, i.e., a region of metallic electrical conductivity on the GaAs active region by the inventive etching process. This contact pad and an adjacent gate structure as shown in FIG. 2 and are denoted by 33 and 34 respectively. (The proportion of gate and source size is not exact for purposes of clarity.)

Figure 5:
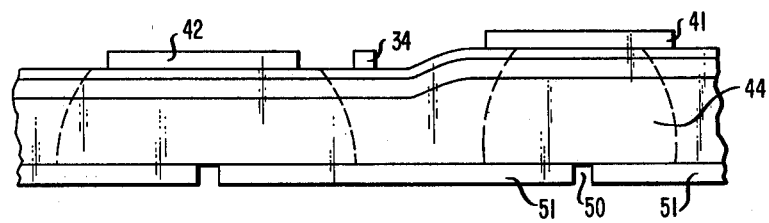
Figure 6:
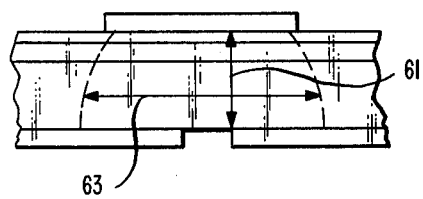

In processing the GaAs layers (or layers of III–V semiconductors in other devices) typically numerous source pads, gate pads, and drain pads are formed. Additionally, thickness irregularities are also unavoidably formed through this processing. For example, for typical device thicknesses of 30 μm, 35 percent deviations in thickness across a wafer are not unusual. The inventive devices result from the realization that when chemical wet etching with its isotropic behavior is performed to produce the via passage, the outcome is often totally unacceptable. This unacceptability results from thickness variations in the device layers in conjunction with the inherent characteristics of isotropic etching. For example, the isotropic etching proceeds acceptably to contact pad 41, (FIG. 5) however, at pad 42 where the GaAs layers are thinner, etching continues during the additional period necessary to etch through the thicker region, 44. The etch thus proceeds beyond the limits of the source pad and the pad collapses. Even if a suitably small entrance opening, 50, through a delineating material, e.g., a resist, 51, is employed and etching proceeds so that none of the contact areas collapse, the resulting structure shown in FIG. 6 has a very low aspect ratio, i.e., the ratio between the passage depth, 61, and its width at the midpoint between the passage opening and its bottom, 63. A low aspect ratio leads to difficulty in controlling the width of the pit at the pad. This control problem occurs because a small variation in substrate thickness yields a large difference in opening width at the pad. It has been found that to avoid these results and to achieve excellent reliability, (1) the opening 32 (FIG. 3) at point 31 must be narrower than the pad width, 36, (2) the angle between a normal to the plane of the substrate exposed surface and an imaginary line drawn from the point of intersection of the sidewall with the exposed surface of the substrate to the midpoint of the sidewall is no larger than ±10 degrees, and (3) the aspect ratio of the etch pit, i.e., the ratio of the depth, 29 (see FIG. 3), to the width at the midpoint, 22, is greater than 0.5. These necessary parameters are satisfied by using the $BCl_3$/source of chlorine etchant described above on a III–V semiconductor device, e.g., a GaAs FET, that has been appropriately delineated using conventional lithographic technology.

After the via path is made, contact through this path to the area of metallic conductivity is advantageously produced by a gold-plating procedure. In a preferred embodiment, this procedure is done by an expedient technique such as electroless gold-plating that is described in U.S. Pat. No. 4,162,337, issued July 24, 1979.

The following example is illustrative of processing conditions used in the subject anisotropic etching process to form the subject devices:

EXAMPLE

Gallium arsenide FETs were fabricated on one side of a 500 micron thick wafer of GaAs by methods described in *IEEE Transactions on Microwave Theory and Techniques,* Vol. MTT-27, page 367, (1979). The thickness of the GaAs wafer was then reduced to approximately 30 microns by thinning in a chemical-mechanical etching apparatus described in U.S. Pat. No. 4,244,775 issued to L. A. D'Asaro. A film of negative photoresist material having a thickness of approximately 2 μm was deposited on the surface of the wafer that does not contact the FETs. This masking material was exposed to ultraviolet light using a mercury vapor lamp through a mask which has been aligned to expose a region in the resist that has the same shape as and is slightly smaller than the source pads of the FETs. The photoresist was developed and baked at 80 degrees C. for 20 minutes to harden the resist. The wafer was cleaned with an oxygen plasma and was placed with the resist side exposed on the rf driven electrode of a radial flow plasma-etch apparatus. (The apparatus is described by Smith and Mogab, *Thin Film Processes,* Academic Press, (1978) p. 510). The electrodes used in this apparatus were parallel plates spaced 1⅛ inches apart. The apparatus was evacuated to less than 35 microns pressure. A gas composition of 6 percent $Cl_2$ and 94 percent $BCl_3$ at a total pressure of 154 μm was introduced into the apparatus. The etching was initiated by striking a plasma with an rf power of 600 Watts (corresponding to a power density of 0.6 $W/cm^2$ at a standard frequency of 13.54 MHz). This was done by holding one electrode at ground and applying the rf power to the electrode with the sample on it. After 90 minutes, the plasma was extinguished, the apparatus vented, and the sample removed.

Following etching, the etch voids were plated with electroless gold. This plating was accomplished by first removing the photoresist with trichloroethylene. The sample was then cleaned in an oxygen plasma. The sample was immersed for 1 minute in the activator solution that is described in U.S. Pat. No. 4,162,337. The sample was removed from the solution, rinsed in distilled water, and dried. The sample was then immersed in the electroless gold-plating bath also described in U.S. Pat. No. 4,162,337. The bath was held at a temperature of 70 degrees C. and the sample was agitated for 40 minutes. The sample was removed, rinsed in distilled water and dried.

We claim:

1. A semiconductor device comprising an active region supported by a substrate, said device having a region of metallic conductivity in intimate contact with the exposed surface of said active region, the extent of said region of metallic conductivity being defined by a boundary of said region of metallic conductivity, and wherein electrical contact to said region of metallic conductivity is made through a void starting at the exposed surface of said substrate and continuing through said substrate and through said active region to said region of metallic conductivity, said void including a sidewall which encompasses said void, and a bottom adjacent said region of metallic conductivity, characterized in that said active region comprises a III–V semiconductor material, the angle between a normal to the plane of the exposed surface of said substrate and an imaginary line drawn from the point of intersection of the sidewall with the exposed surface of the substrate to the midpoint of the sidewall is no larger than ±10 degrees, the bottom of said void does not extend beyond the boundary of said region of metallic conductivity, and the ratio of the depth of said void to the width at the midpoint of said void is greater than 0.5.

2. The device of claim 1 wherein said active region comprises GaAs.

3. The device of claim 1 wherein said region of metallic conductivity is chosen from the group consisting of a drain pad, a source pad, and a gate pad.

* * * * *